United States Patent
Miyazaki et al.

(10) Patent No.: US 11,255,942 B2
(45) Date of Patent: *Feb. 22, 2022

(54) MAGNETIC RESONANCE IMAGING APPARATUS

(71) Applicant: Toshiba Medical Systems Corporation, Otawara (JP)

(72) Inventors: Mitsue Miyazaki, Otawara (JP); Keiichiro Ishi, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/251,319

(22) Filed: Aug. 30, 2016

(65) Prior Publication Data

US 2018/0059201 A1 Mar. 1, 2018

(51) Int. Cl.
*G01R 33/561* (2006.01)
*G01R 33/563* (2006.01)
(Continued)

(52) U.S. Cl.
CPC ..... *G01R 33/5617* (2013.01); *G01R 33/3815* (2013.01); *G01R 33/5635* (2013.01); *G01R 33/4818* (2013.01)

(58) Field of Classification Search
CPC ............ G01R 33/3815; G01R 33/5617; G01R 33/5635; G01R 33/5615; G01R 33/586
See application file for complete search history.

(56) References Cited

U.S. PATENT DOCUMENTS

2008/0319301 A1 12/2008 Busse
2010/0013479 A1* 1/2010 Park ................. G01R 33/54
324/309

(Continued)

FOREIGN PATENT DOCUMENTS

JP 2005-21690 A 1/2005
JP 2013-240589 A 12/2013
JP 2015-8903 A 1/2015

OTHER PUBLICATIONS

Busse, Reed F. "Reduced RF power without blurring: correcting for modulation of refocusing flip angle in FSE sequences." Magnetic Resonance in Medicine: An Official Journal of the International Society for Magnetic Resonance in Medicine 51.5 (2004): 1031-1037. (Year: 2004).*

(Continued)

*Primary Examiner* — Rishi R Patel

(74) *Attorney, Agent, or Firm* — Oblon, McClelland, Maier & Neustadt, L.L.P.

(57) ABSTRACT

In one embodiment, a magnetic resonance imaging apparatus includes memory circuitry configured to store a predetermined program; and processing circuitry configured, by executing the predetermined program, to set an FSE type pulse sequence in which an excitation pulse is followed by a plurality of refocusing pulses, the plurality of the refocusing being divided into at least a first pulse group subsequent to the excitation pulse and a second pulse group subsequent to the first pulse group, the first pulse group including refocusing pulses having a predetermined high flip angle, and the second pulse group including refocusing pulses having flip angles decreased from the predetermined high flip angle toward a flip angle of zero, and generate an image of an object from respective MR signals corresponding to the plurality of refocusing pulses acquired by applying the fast spin echo type pulse sequence to the object.

10 Claims, 12 Drawing Sheets

(51) Int. Cl.
*G01R 33/3815* (2006.01)
*G01R 33/48* (2006.01)

(56) References Cited

U.S. PATENT DOCUMENTS

| | | | |
|---|---|---|---|
| 2011/0133735 A1 | 6/2011 | Yokosawa et al. | |
| 2011/0291651 A1 | 12/2011 | Umeda | |
| 2012/0141007 A1 | 6/2012 | Takizawa et al. | |
| 2013/0285662 A1 | 10/2013 | Takeshima | |
| 2014/0028313 A1* | 1/2014 | Paul | G01R 33/56 324/309 |
| 2015/0190055 A1* | 7/2015 | Park | A61B 5/055 600/410 |

OTHER PUBLICATIONS

Paul, Dominik, Jurgen Hennig, and Maxim Zaitsev. "Intrinsic fat suppression in TIDE balanced steady-state free precession imaging." Magnetic Resonance in Medicine: An Official Journal of the International Society for Magnetic Resonance in Medicine 56.6 (2006): 1328-1335. (Year: 2006).*
David C. Alsop, "The Sensitivity of Low Flip Angle RARE Imaging" Magnetic Resonance in Medicine, vol. 37, 1997, pp. 176-184.
Office Action dated Jan. 28, 2019, in co-pending U.S. Appl. No. 15/881,427.
Office Action dated Jun. 20, 2019, in co-pending U.S. Appl. No. 15/881,427.
Japanese Office Action dated Aug. 18, 2020 in Japanese Patent Application No. 2016-204446, 5 pages.
Japanese Office Action dated Nov. 17, 2020 in Japanese Patent Application No. 2016-20446, 4 pages.
Karla L Miller, et al, "Steady-state sequences: Spoiled and balanced methods," Proc. Intl. Soc. Mag. Reson. Med., vol. 22, 2014, 9 pages.
Japanese Office Action dated Feb. 24, 2021 in Japanese Patent Application No. 2016-204446, 4 pages.
Matthias Weigel, et al., "Inversion Recovery Prepared Turbo Spin Echo Sequences with Reduced SAR Using Smooth Transitions Between Pseudo Steady States" Magnetic Resonance in Medicine, vol. 57, 2007, pp. 631-637.

* cited by examiner

MAGNETIC RESONANCE IMAGING APPARATUS

FIELD

Embodiments described herein relate generally to a magnetic resonance imaging (MRI) apparatus.

BACKGROUND

An MRI apparatus is an imaging apparatus configured to excite nuclear spin of an object placed in a static magnetic field with a radio frequency (RF) pulse having the Larmor frequency and reconstruct an image based on magnetic resonance (MR) signals emitted from the object due to the excitation.

In recent years, technology to further enhance static-magnetic-field intensity of an MRI apparatus has been developed. A 3 Tesla type MRI apparatus whose static-magnetic-field intensity is two times stronger than a conventional 1.5 Tesla type MRI apparatus has already begun to spread. Clinically practical use of an ultrahigh magnetic-field type MRI apparatus in which static-magnetic-field intensity is further enhanced (e.g., 7 Tesla type and 11 Tesla type) is anticipated in the future.

A signal to noise ratio (SNR) of an MR signal is enhanced by enhancing static-magnetic-field intensity. It is also said that an SNR is enhanced substantially in proportion to static-magnetic-field intensity. Spatial resolution and time resolution can be improved by enhancing an SNR.

However, stronger static-magnetic-field intensity leads to longer longitudinal relaxation time T1. Thus, for instance, when plural excitation pulses are used for imaging under a fast spin echo (FSE) type pulse sequence, it is required to wait recovery of longitudinal magnetization by lengthening a repetition time TR. As a result, an imaging time is lengthened.

Meanwhile, a specific absorption rate (SAR) is known as an index indicative of magnitude of thermal influence on a human body. An SAR is in proportion to square of product of static-magnetic-field intensity $B_0$ and an flip angle FA of an RF pulse (i.e., an SAR is in proportion to $(B_0*FA)^2$). Thus, in an MRI apparatus with higher static-magnetic-field intensity, requirements for reducing the SAR becomes stronger. In particular, in an FSE-type pulse sequence, in which refocusing pulses of high flip angles (e.g., 180°) are sequentially applied subsequent to a 90° pulse, the requirements for reducing the SAR becomes much more stronger.

DETAILED DESCRIPTION

Hereinafter, an MRI apparatus 1 of the present embodiment will be described with reference to the accompanying drawings.

In one embodiment, a magnetic resonance imaging apparatus includes memory circuitry configured to store a predetermined program; and processing circuitry configured, by executing the predetermined program, to set an FSE type pulse sequence in which an excitation pulse is followed by a plurality of refocusing pulses, the plurality of the refocusing being divided into at least a first pulse group subsequent to the excitation pulse and a second pulse group subsequent to the first pulse group, the first pulse group including refocusing pulses having a predetermined high flip angle, and the second pulse group including refocusing pulses having flip angles decreased from the predetermined high flip angle toward a flip angle of zero, and generate an image of an object from respective MR signals corresponding to the plurality of refocusing pulses acquired by applying the fast spin echo type pulse sequence to the object.

(Configuration)

Figure 1:
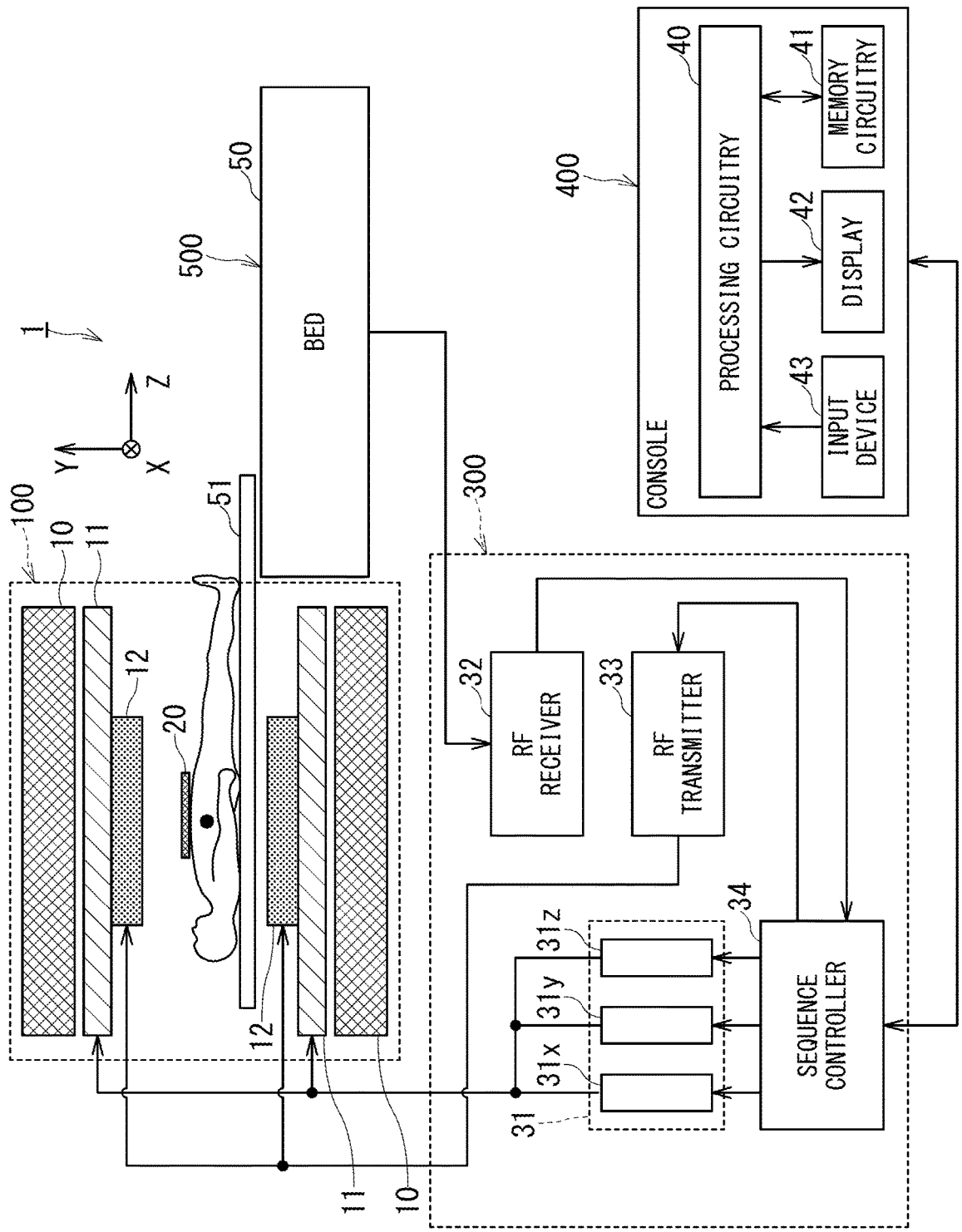
FIG. 1 is a block diagram illustrating overall configuration of the MRI apparatus of the present embodiment.

FIG. 1 is a block diagram illustrating overall configuration of the MRI apparatus 1 of the present embodiment. The MRI apparatus 1 of the present embodiment includes a gantry 100, a control cabinet 300, a console 400, and a bed 500.

The gantry 100 includes, e.g., a static magnetic field magnet 10, a gradient coil 11, a whole body (WB) coil 12, and these components are included in a cylindrical housing. The bed 500 includes a bed body 50 and a table 51. Additionally, The MRI apparatus 1 further includes an array coil 20 to be attached to an object.

The control cabinet 300 includes three gradient coil power supplies 31 (to be exact, 31x for an X-axis, 31y for a Y-axis, and 31z for a Z-axis), an RF receiver 32, an RF transmitter 33, and a sequence controller 34.

The static magnetic field magnet 10 of the gantry 100 is substantially in the form of a cylinder, and generates a static magnetic field inside the bore, i.e., the space inside the cylindrical structure of the static magnetic field magnet 10 which is an imaging region of an object (e.g., a patient). The static magnetic field magnet 10 includes a superconducting coil inside, and the superconducting coil is cooled down to an extremely low temperature by liquid helium. The static magnetic field magnet 10 generates a static magnetic field by supplying the superconducting coil with electric current provided from a non-illustrated static magnetic field power supply in an excitation mode. Afterward, the static magnetic field magnet 10 shifts to a permanent current mode, and the static magnetic field supply is separated. Once it enters the permanent current mode, the static magnetic field magnet 10 continues to generate a strong static magnetic field for a long time, e.g., over one year. Note that the static magnetic field magnet 10 may be configured as a permanent magnet.

The gradient coil 11 is also substantially in the form of a cylinder, and is fixed to the inside of the static magnetic field magnet 10. This gradient coil 11 applies gradient magnetic fields to an object in the respective directions of the X-axis, the Y-axis, and the Z-axis, by using electric currents supplied from the gradient coil power supplies 31*x*, 31*y*, and 31*z*.

The bed body 50 of the bed 500 moves the table 51 in the upward and downward directions, and sets the table 51 with an object loaded thereon to a predetermined height before imaging. When the object is imaged, the bed body 50 moves the table 51 in a horizontal direction so as to move the object inside the bore.

The WB body coil is shaped substantially in the form of a cylinder so as to surround an object, and is fixed to the inside of the gradient coil 11. The WB coil 12 applies RF pulses transmitted from the RF transmitter 33 to the object, and receives MR signals emitted from the object due to excitation of hydrogen nuclei.

The array coil 20 is an RF coil, and receives MR signals emitted from the object at positions adjacent to the object. The array coil 20 is, for instance, configured of plural coil elements. Although there are various types for the array coil 20 such as a head coil, a chest coil, a spine coil, and a whole-body type coil according to an anatomical imaging part of the object, the array coil 20 for the chest part is illustrated in FIG. 1.

The RF transmitter 33 transmits RF pulses to the WB coil 12 based on commands inputted from the sequence controller 34.

The RF receiver 32 receives MR signals received by the WB coil 12 and/or the array coil 20, and transmits raw data obtained by digitizing the received MR signals to the sequence controller 34.

The sequence controller 34 performs a scan of an object by driving the gradient coil power supplies 31, the RF transmitter 33, and the RF receiver 32, under the control of the console 400. When the sequence controller 34 receives raw data from the RF receiver 32 by performing a scan, the sequence controller 34 transmits the received raw data to the console 400.

The sequence controller 34 includes non-illustrated processing circuitry, which may be configured as hardware such as a field programmable gate array (FPGA) or an application specific integrated circuit (ASIC), or may be configured as a processor for executing predetermined programs.

The console 400 is configured as a computer including processing circuitry 40, memory circuitry 41, an input device 43, and a display 42.

The memory circuitry 41 is a recording medium including a read-only memory (ROM) and a random access memory (RAM) in addition to an external memory device such as a hard disk drive (HDD) and an optical disc device. The memory circuitry 41 stores various programs executed by a processor of the processing circuitry 40 as well as various kinds of data and information.

The input device 43 includes various devices for an operator to input various kinds of information and data, and is configured of, e.g., a mouse, a keyboard, a trackball, and/or a touch panel. The display 42 is a display device such as a liquid crystal display panel, a plasma display panel, and an organic EL panel.

The processing circuitry 40 is, e.g., a circuit equipped with a CPU and/or a special-purpose or general-purpose processor. The processor implements various functions described below by executing programs stored in the memory circuitry 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 performs system control of the entirety of the magnetic resonance imaging apparatus 1. Specifically, the console 400 receives commands and various kinds of information such as imaging conditions inputted via a mouse and a keyboard of the input device 43 operated by an operator such as an inspection examiner or a radiologist. Then, the processing circuitry 40 causes the sequence controller 34 to perform a scan based on the inputted imaging conditions, and then reconstructs images based on raw data transmitted from the sequence controller 34. Reconstructed images may be displayed on the display 42 and/or may be stored in the memory circuitry 41.

Further, the MRI apparatus 1 of the present embodiment reconstructs an image of an object from MR signals acquired by executing a scan under a predetermined pulse sequence described below. In particular, each pulse sequence of the present embodiment has a feature in that an SAR is reduced and an imaging time is more shortened than conventional technology.

Figure 2:
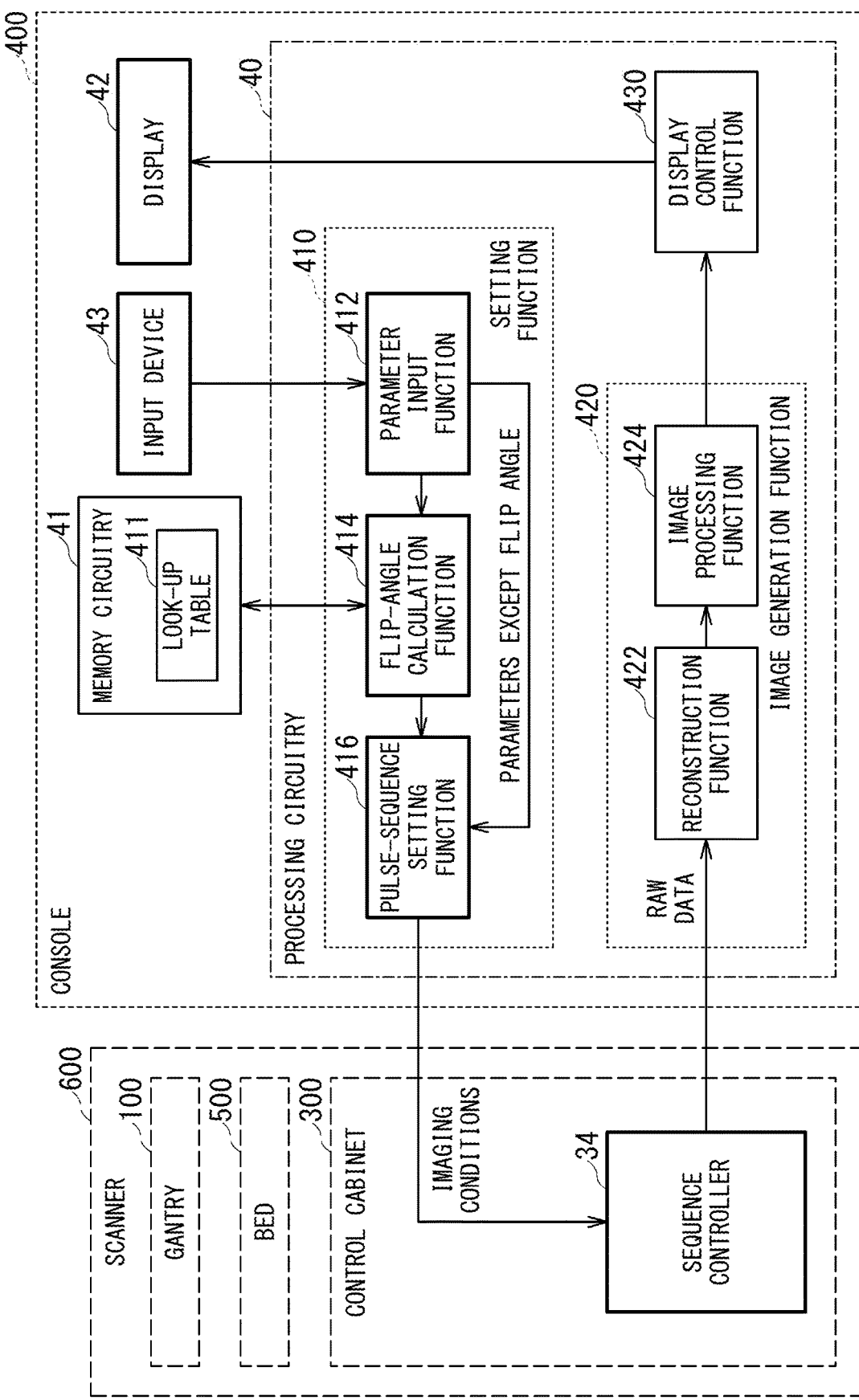
FIG. 2 is a block diagram of components relevant to setting of pulse sequences in the MRI apparatus of the present embodiment.
Figure 3:
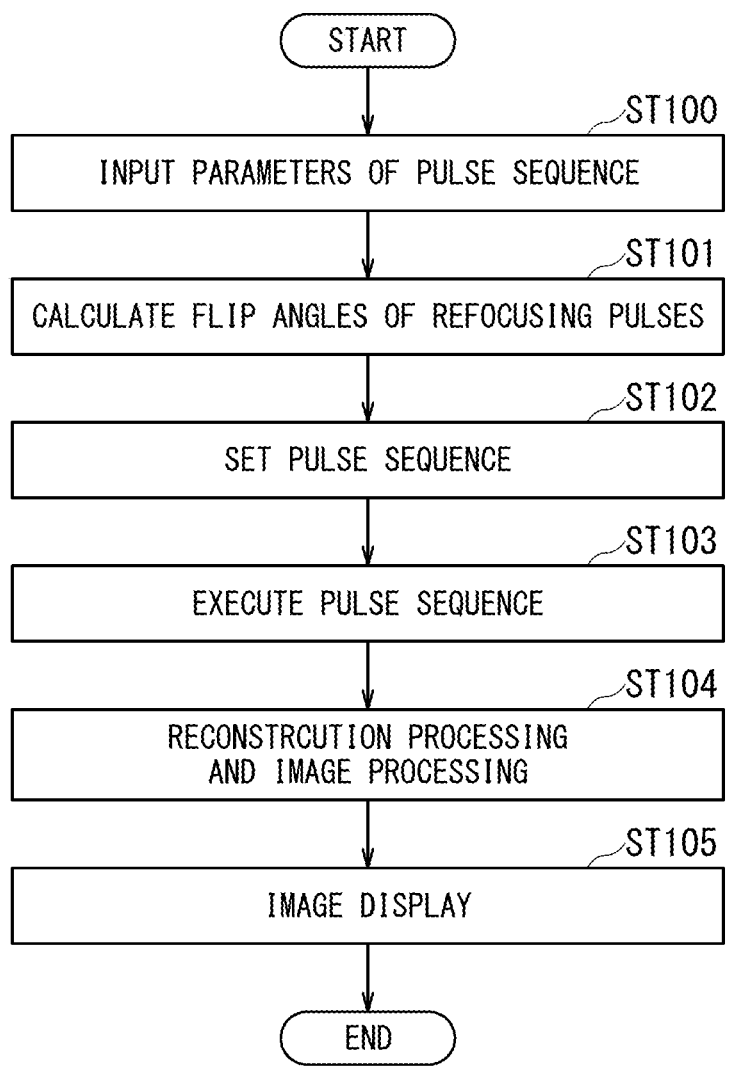
FIG. 3 is a flowchart illustrating processing performed by the MRI apparatus of the present embodiment.

FIG. 2 is a block diagram of the MRI apparatus 1 configured to set such a characteristic pulse sequence and generate MR images of an object by applying such a pulse sequence. Additionally, FIG. 3 is a flowchart illustrating processing performed by the MRI apparatus 1.

As shown in FIG. 2, the processing circuitry 40 of the MRI apparatus 1 implements a setting function 410, an image generation function 420, and a display control function 430.

The setting function 410 further includes a parameter input function 412, a flip-angle calculation function 414, and a pulse-sequence setting function 416. Meanwhile, the image generation function 420 includes a reconstruction function 422 and an image processing function 424. As described above, the processor of the processing circuitry 40 implements each of those functions by executing predetermined programs.

Note that, among the components of the MRI apparatus 1 shown in FIG. 1, the components excluding the console 400 (i.e., the entirety of the control cabinet 300, the gantry 100, and the bed 500) constitute a scanner 600.

The memory circuitry 41 stores parameters and data for setting various types of standard pulse sequences, according to an imaging purpose and/or anatomical imaging part of the object to be imaged. Additionally, when plural pulse sequences are executed in series, protocol data such as standard execution temporal order of those pulse sequences are also stored in the memory circuitry 41.

The parameter input function 412 reads out parameters for setting respective pulse sequences and data related to execution temporal order of respective pulse sequences from the memory circuitry 41, and transmits those parameters and data to the pulse-sequence setting function 416.

Further, the parameter input function 412 causes the display 42 to display parameters of respective pulse sequences and execution temporal order of respective pulse sequences via the display control function 430. An operator can confirm the contents displayed in the display 42, and then the operator may change values of parameters and/or execution temporal order by operating the input device 43 as needed.

Furthermore, the memory circuitry 41 stores a look-up table 411. In the look-up table 411, parameters for calculating flip angles of an FSE-type pulse sequence are included. A characteristic FSE-type pulse sequence is used for imaging in the present embodiment as described below. Note that, instead of the parameters for calculating flip angles, values of respective flip angles of the FSE-type pulse sequence as such may be directly included in the look-up table 411.

The parameter input function 412 inputs parameters for calculating respective flip angles of the FSE-type pulse sequence or values of respective flip angles of the FSE-type pulse sequence from the look-up table 411.

The above-described processing implemented by the parameter input function 412 corresponds to the step ST100 in FIG. 3.

The flip-angle calculation function 414 calculates flip angles of respective refocusing pulses of the FSE-type pulse sequence based on parameters included in the look-up table 411, and outputs the calculation result to the pulse-sequence setting function 416. Additionally or alternatively, the flip-angle calculation function 414 may read out flip angles of respective refocusing pulses from the look-up table 411 in the memory circuitry 41 and outputs those flip angles to the pulse-sequence setting function 416.

The above-described processing implemented by the flip-angle calculation function 414 corresponds to the processing of the step ST101 in FIG. 3. More detailed processing of the flip-angle calculation function 414 will be described below.

The pulse-sequence setting function 416 sets various parameters of the pulse sequence by using flip angles of respective refocusing pulses, which is inputted from the flip-angle calculation function 414, and parameters except the flip angles, which is inputted from the parameter input function 412. For example, when parameters for the FSE-type pulse sequence is set, the above-described parameters except the flip angles include echo train spacing (ETS), echo train length (ETL), an effective echo time TEeff, a repetition time TR, matrix size, size of field of view (FOV), a phase encode direction, a readout direction, and so forth.

The above-described processing implemented by the pulse-sequence setting function 416 corresponds to processing of the step ST102 in FIG. 3. Pulse sequences to be set by the pulse-sequence setting function 416 will be also described below in detail.

Parameters having been set by the pulse-sequence setting function 416 are outputted to the sequence controller 34. The sequence controller 34 executes the pulse sequence set as described above, when receiving a command to start imaging inputted by an operator via the input device 43, for instance. Specifically, the sequence controller 34 executes imaging of an object by applying RF pulses (i.e., excitation pulses and refocusing pulses) and gradient pulses to the object based on the set pulse sequence. Execution of the imaging of the object corresponds to the processing of the step ST103 in FIG. 3.

According to application of the pulse sequence, MR signals are emitted from the object. The MR signals are received by the WB coil 12 and/or the array coil 20, and the received MR signals are inputted to the reconstruction function 422 via the sequence controller 34. The MR signals inputted to the reconstruction function 422 may be referred to as raw data or k-space data.

The reconstruction function 422 reconstructs a real-space image by performing two-dimensional or three-dimensional inverse Fourier transform (IFFT) on the inputted MR signals (i.e., k-space data). The processing implemented by the reconstruction function 422 corresponds to the processing of the step ST104 in FIG. 3.

A reconstructed real-space image is subjected to predetermined image processing such as maximum intensity projection (MIP) or predetermined rendering processing by the image processing function 424. The processing implemented by the image processing function 424 also corresponds to the processing of the step ST104 in FIG. 3.

It is known that there is an imaging method called a Fresh blood imaging (FBI) as one of imaging techniques of non-contrast magnetic resonance angiography (MRA). In the FBI method, electrocardiographic synchronization and an FSE-type pulse sequence may be used in combination. In the FBI method, for instance, an image in which an artery and a vein are clearly separated from each other can be generated by performing a subtraction processing between an image acquired in systole and an image acquired in diastole. The above-described subtraction processing used in an FBI method is also implemented by the image processing function 424.

Meanwhile, a time-spatial labeling inversion pulse (Time-SLIP) method is also known as one of imaging techniques of non-contrast NRA. Among various types of Time-SLIP methods, there is an imaging method in which a blood vessel image with a sufficiently suppressed background is generated, by performing subtraction processing between an image generated by applying a region-selective inversion pulse as a labeling pulse and an image generated without applying a labeling pulse. This subtraction processing in the Time-SLIP method is also implemented by the image processing function 424.

An image subjected to the image processing by the image processing function 424 is further subjected to display control processing by the display control function 430 so as to cause the display 42 to display the image in a desired manner. The processing implemented by the display control function 430 corresponds to the processing of the step ST105 in FIG. 3.

(Pulse Sequence)

Hereinafter, an FSE-type pulse sequence, which is set and used by the MRI apparatus 1 of the present embodiment, will be described in detail.

The FSE-type pulse sequence of the present embodiment may be a two-dimensional type, in which MR signals are acquired from two-dimensional multi-slices, or a three-dimensional type, in which a slab of predetermined thickness is three-dimensionally excited and MR signals are acquired while encoding the slab.

Figure 4:
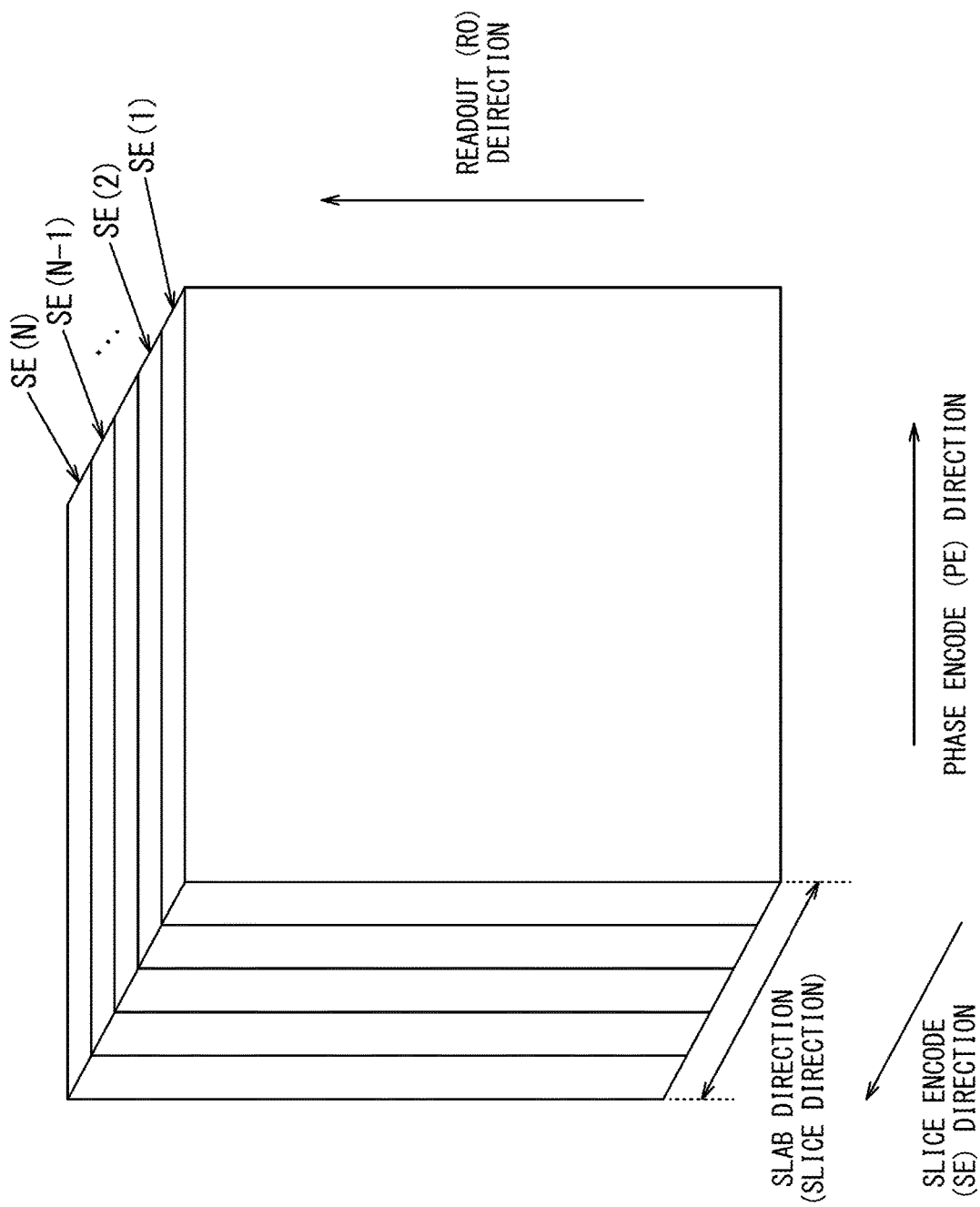
FIG. 4 is a schematic diagram illustrating an application region of a three-dimensional type pulse sequence.

FIG. 4 is a schematic diagram illustrating an application region of a three-dimensional-type pulse sequence. Hereinafter, a description will be given of a case for a three-dimensional FSE-type pulse sequence. In this 3-D pulse sequence, as shown in FIG. 4, a slab having predetermined thickness in the slice direction is excited and encoded in the slice direction with slice encodes SE(1) to SE(N). In an FSE-type pulse sequence, plural refocusing pulses are applied subsequent to an excitation pulse (an RF pulse whose flip angle is, e.g., 90°) and phase encodes of respective refocusing pulses are set to values different from each other. In the case of FIG. 4, the lateral direction is assumed to correspond to a phase encode (PE) direction (e.g., a right-left direction of an object) and the vertical direction (e.g., a head-foot direction of an object) is assumed to correspond a readout (RO) direction.

Figure 5:
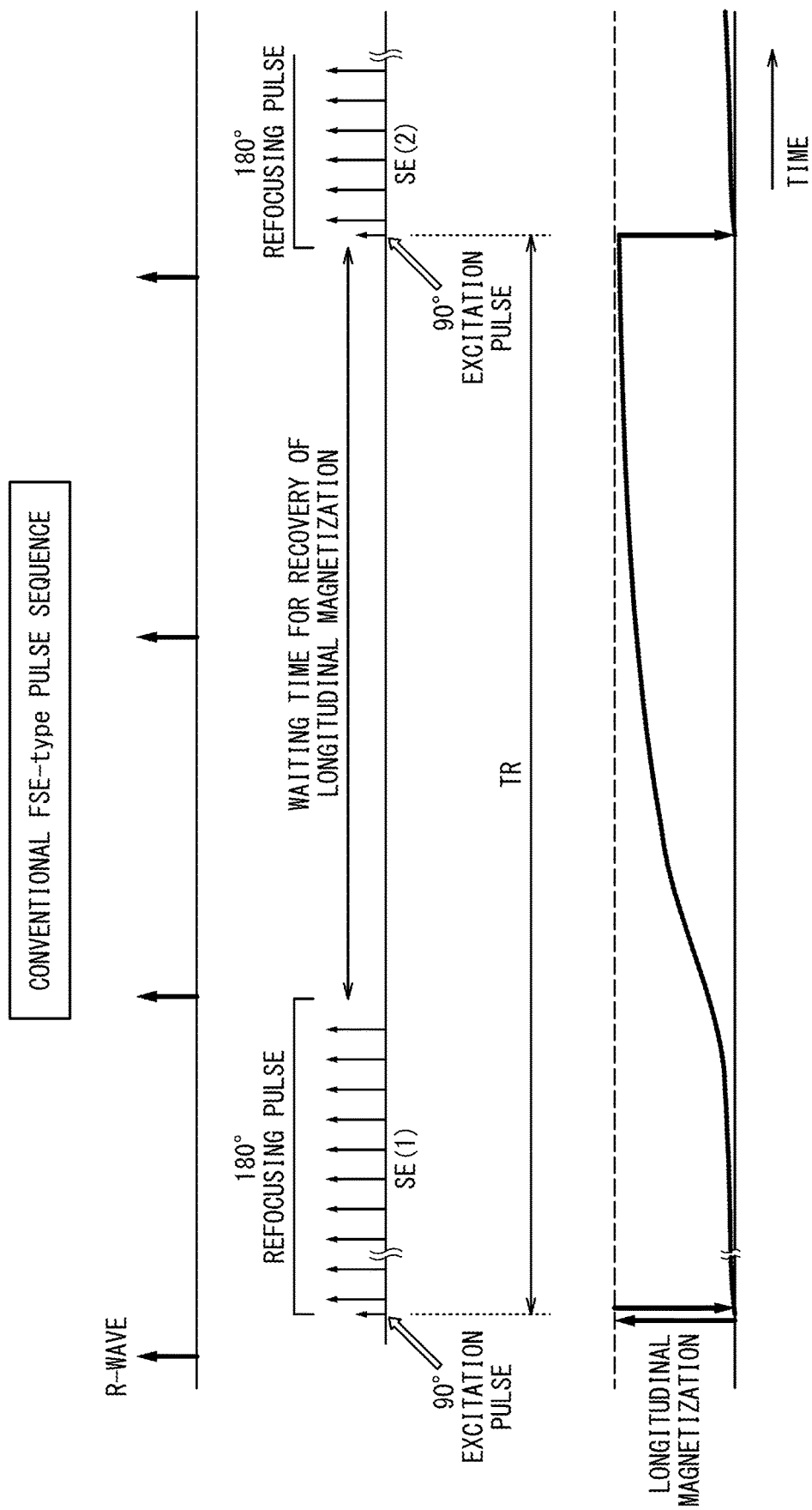
FIG. 5 is a timing chart illustrating a conventional FSE-type pulse sequence.

FIG. 5 is a timing chart illustrating a conventional FSE-type pulse sequence for comparison with an FSE-type pulse sequence of the present embodiment. In the conventional FSE-type pulse sequence shown in FIG. 5, plural refocusing pulses each of which has a high flip angle (e.g., a flip angle of 180°) are applied subsequent to an excitation pulse whose flip angle is 90°. Note that, in the conventional SE-type pulse sequence, all of the flip angles of respective refocusing pulses are set to a predetermined constant value.

As shown in FIG. 5, by applying the first 90° excitation pulse, longitudinal magnetization is brought to be zero and transverse magnetization is generated. Then, during each period of every adjacent two refocusing pulses subsequent to the first 90° excitation pulse, MR signals of a slice corresponding to the slice encode SE(1) are acquired. The pulse sequence shown in FIG. 5 illustrates an FSE-type pulse sequence of one-shot type in which all the MR signals for one slice are acquired during each application period of a series of refocusing pulses following one 90° excitation pulse are applied.

Longitudinal magnetization brought to temporarily become zero by the first 90° excitation pulse then exponentially recovers with a time constant corresponding to a longitudinal relaxation time T1. Then, at the timing when longitudinal magnetization is sufficiently recovered, the second 90° excitation pulse is applied and MR signals for the slice corresponding to the slice encode SE(2) are acquired.

If each of the second and subsequent 90° excitation pulses is applied before longitudinal magnetization is sufficiently recovered, longitudinal magnetization at the application timing of each of the second and subsequent 90° excitation pulses is smaller than the initial longitudinal magnetization and a value of transverse magnetization correspondingly becomes smaller. Accordingly, intensity of each of acquired MR signals becomes smaller, which reduces an SNR. For avoiding the reduction of SNR, in a conventional FSE-type pulse sequence, a waiting time for ensuring sufficient recovery of longitudinal magnetization is inserted between a 90° excitation pulse and the next 90° excitation pulse. As a result, an interval between a 90° excitation pulse and the next 90° excitation pulse, i.e., a repetition time becomes long, and consequently imaging time becomes long in a conventional FSE-type pulse sequence. In particular, under a static magnetic field equal to or stronger than 3 Tesla, since a longitudinal relaxation time T1 becomes long, it has been needed to set a longer repetition time TR as compared with a widely-used 1.5 Tesla type MRI apparatus.

In FIG. 5, R-waves of electrocardiographic signals are also indicated for intuitively illustrating length of a repetition time TR (the same holds true for FIG. 6 described below). For instance, in the conventional FSE-type pulse sequence, a repetition time TR is substantially as long as 3 R-R intervals (i.e., three times as long as one R-R interval), and ⅔ of this repetition time TR is used for a waiting time for recovery of longitudinal magnetization during which an MR signal is not acquired.

Figure 6:
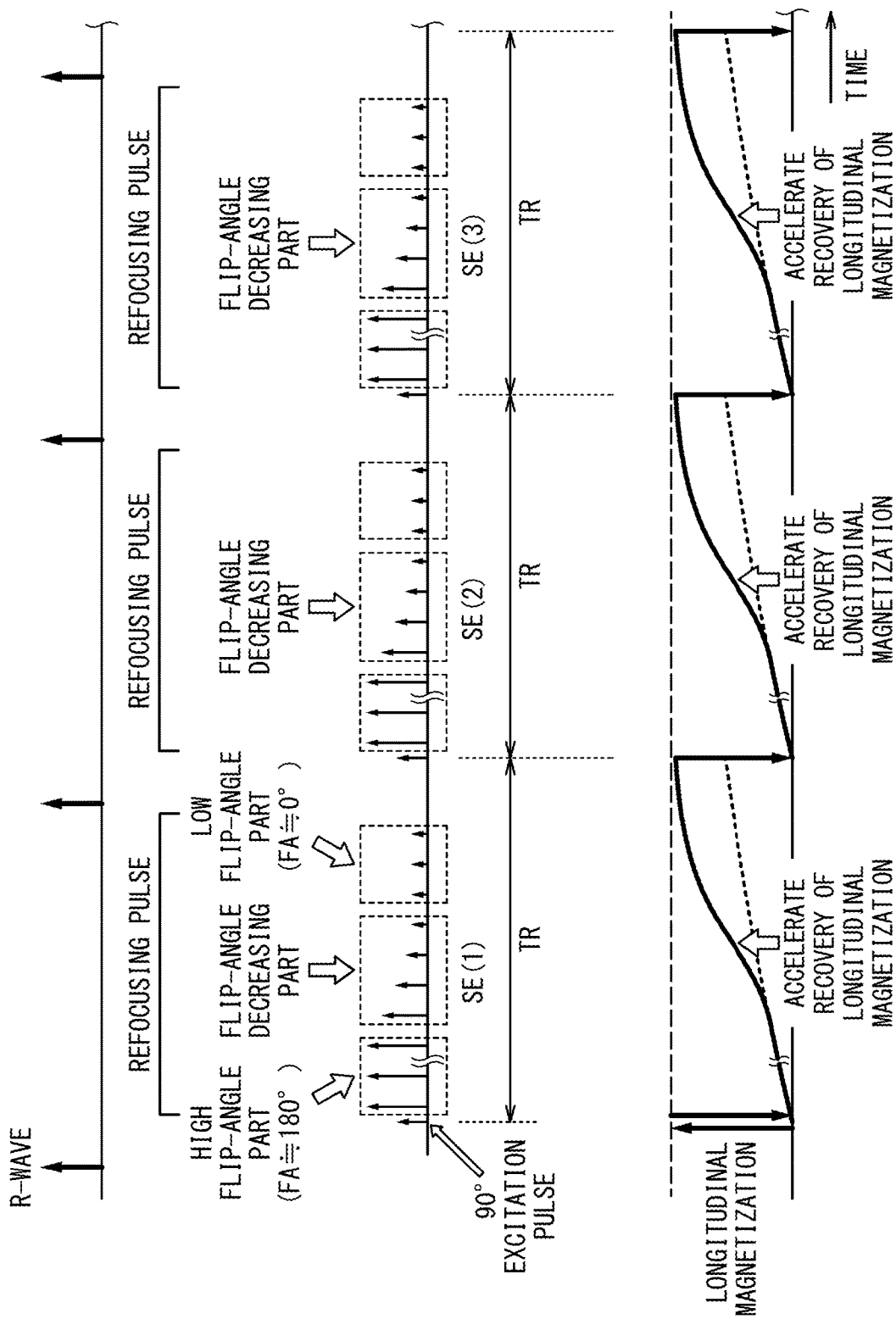
FIG. 6 is a schematic timing chart illustrating an FSE-type pulse sequence of the present embodiment.

FIG. 6 is a schematic timing chart illustrating an FSE-type pulse sequence of the present embodiment. Although R-waves are indicated in FIG. 6 similarly to FIG. 5, the FSE-type pulse sequence of the present embodiment is not necessarily used for an electrocardiographic synchronization imaging. The FSE-type pulse sequence of the present embodiment may be used for the electrocardiographic synchronization imaging, or used for imaging without electrocardiographic synchronization.

For comparison with the conventional FSE-type pulse sequence, the FSE-type pulse sequence of the present embodiment shown in FIG. 6 also illustrates a one-shot type FSE pulse sequence, in which MR signals used for reconstructing one slice are acquired in each application period of a series of refocusing pulses applied subsequent to one 90° excitation pulse. Further, in the FSE-type pulse sequence of the present embodiment shown in FIG. 6, the number of refocusing pulses is the same as the conventional FSE-type pulse sequence shown in FIG. 5 for comparison.

It should be noted that the FSE-type pulse sequence of the present embodiment shown in FIG. 6 includes a flip-angle decreasing part in a series of refocusing pulses subsequent to one excitation pulse. In the flip-angle decreasing part, flip angles of respective refocusing pulses time-sequentially decreases from a predetermined high flip angle (e.g., 180°) toward 0°.

As shown in the bottom part of FIG. 6, by including the flip-angle decreasing part in the series of refocusing pulses, an effect of accelerating recovery of longitudinal magnetization is obtained. As indicated by a broken-line curve in the bottom part of FIG. 6, a recovery rate of longitudinal magnetization is slow in accordance with a longitudinal relaxation time T1 in the conventional FSE-type sequence, in which the flip-angle decreasing part is not provided.

By contrast, a recovery rate of longitudinal magnetization is accelerated in the FSE-type pulse sequence of the present embodiment in which flip-angle decreasing part is provided, as indicated by the solid-line curve in the bottom part of FIG. 6. The reason for which the recovery of longitudinal magnetization is accelerated will be described below with reference to FIG. 8 and FIG. 9.

By accelerating recovery of longitudinal magnetization as described above, an SNR is not reduced because sufficiently strong longitudinal magnetization is generated at respective application timings of the second and the subsequent excitation pulses, even if each waiting time for recovery of longitudinal magnetization is shortened (i.e., a repetition time TR is shortened). As a result, an imaging time of an FSE-type pulse sequence of the present embodiment can be drastically shortened as compared with a conventional FSE-type pulse sequence. For instance, a repetition time TR required to be as long as 3 R-R intervals as shown in FIG. 5 can be shortened to one R-R interval as shown in FIG. 6.

Intensity of longitudinal magnetization can be further brought closer to an initial value in an FSE-type pulse sequence of the present embodiment by providing a certain length of a waiting time for recovery of longitudinal magnetization. For instance, a repetition time TR can be set to substantially 2 R-R intervals by providing a waiting time as long as one R-R interval. Also in such a case, its repetition time TR is shortened and thus its imaging time is shortened as compared with a conventional FSE-type pulse sequence.

Figure 7:
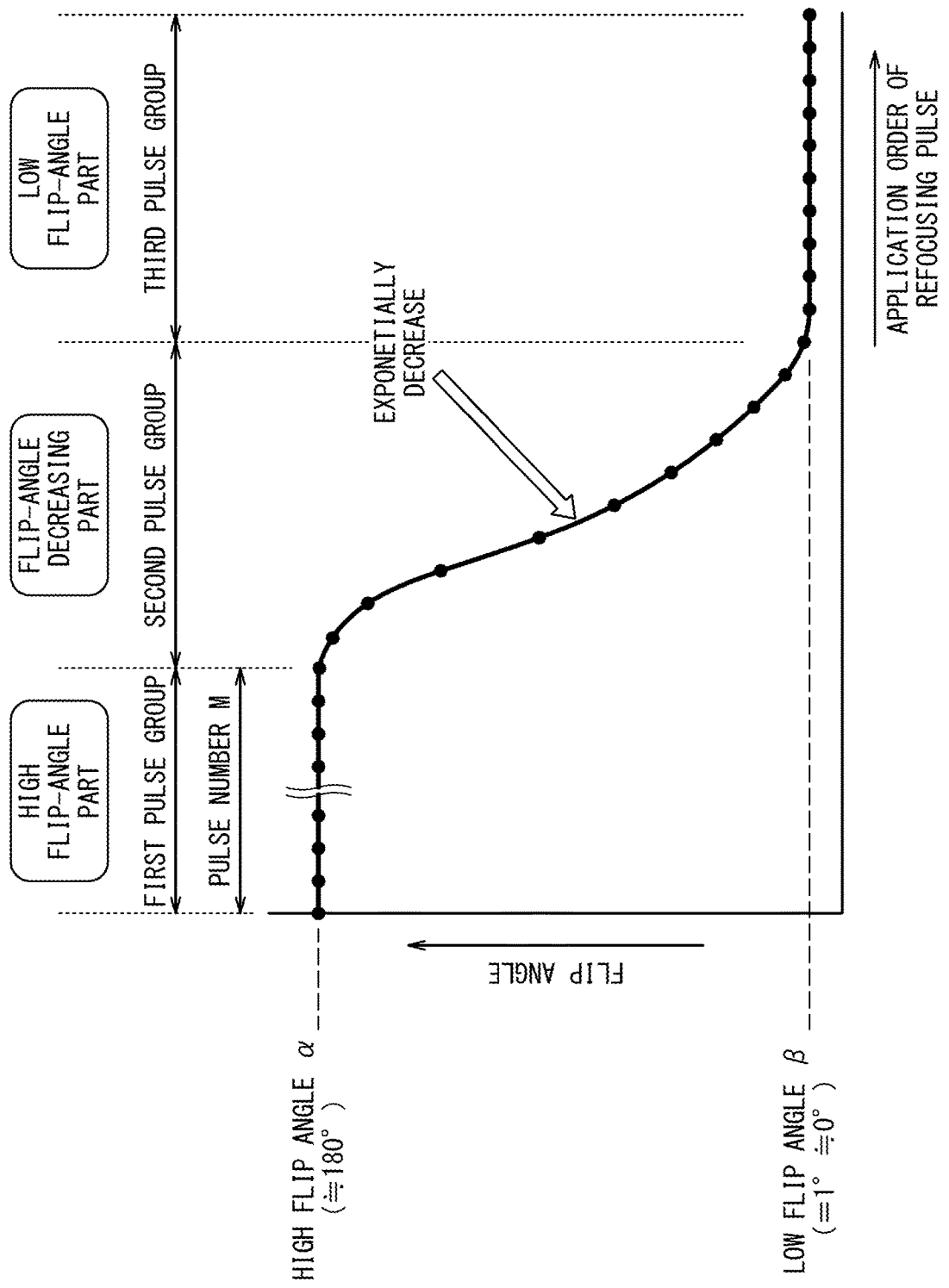
FIG. 7 is a graph illustrating a method of setting flip angles of respective refocusing pulses in an FSE-type pulse sequence of the present embodiment.

FIG. 7 is a graph illustrating a method of setting flip angles of respective refocusing pulses in the FSE-type pulse sequence of the present embodiment. In FIG. 7, the horizontal axis in FIG. 7 indicates temporal application order of refocusing pulses and the vertical axis indicates flip angles of respective refocusing pulses.

A series of refocusing pulses in the FSE-type pulse sequence of the present embodiment include at least a first pulse group and a second pulse group. The first pulse group consists of refocusing pulses whose flip angles are a predetermined high flip angle with a constant value, while flip angles of respective refocusing pulses of the second pulse group time-sequentially decrease from the predetermined high flip angle toward 0°. The first pulse group corresponds to a high flip-angle part, and the second pulse group to be applied subsequent to the first pulse group corresponds to the above-described flip-angle decreasing part.

The above-described predetermined high flip angle is, e.g., a flip angle of 180°. The predetermined high flip angle may be a flip angle slightly higher than 180° (e.g., flip angle of 200°).

Subsequent to the second pulse group, a third pulse group consisting of refocusing pulses whose flip angles are a predetermined low flip angle with a constant value may be applied. The above-described predetermined low flip angle is a flip angle close to 0°, e.g., a flip angle which is equal to or higher than 0° and is lower than 5°. For instance, the predetermined low flip angle may be set to a flip angle of substantially 1°.

For instance, a pattern in which flip angles of respective refocusing pulses exponentially decrease can be used for a decreasing pattern of flip angles in a flip-angle decreasing part. In this case, flip angles of respective refocusing pulses in a flip-angle decreasing part may be exponentially decreased from the predetermined high flip angle and decreasing of the flip-angle may be stopped when the flip angle is reached to a value substantially equal to the predetermined low angle.

A decreasing pattern of flip angles is not limited to an exponential decreasing pattern but may be another pattern such as a linear decreasing pattern or may be a decreasing pattern obtained by extracting a part of curve from a N-th order function curve, where N is an integer equal to or larger than 2.

The flip-angle calculation function 414 can calculate flip angles of respective refocusing pulses in the flip-angle decreasing part when parameters such as a flip angle α of the high flip-angle part, pulse number N in the high flip-angle part, a flip angle β of the low flip-angle part, a reduction coefficient of an exponential function are set. The MRI apparatus 1 may be configured so that, among the above-described parameters, for example, only the high flip angle α can be inputted through the input device 43 by an operator and the rest of the parameters may be previously or preliminarily stored as internal data included in the look-up table 411. Additionally, flip angles of all the refocusing pulses including flip angles in the flip-angle decreasing part may be stored in the look-up table 411 so that the flip-angle calculation function 414 reads out those flip angles from the look-up table 411.

Figure 8:
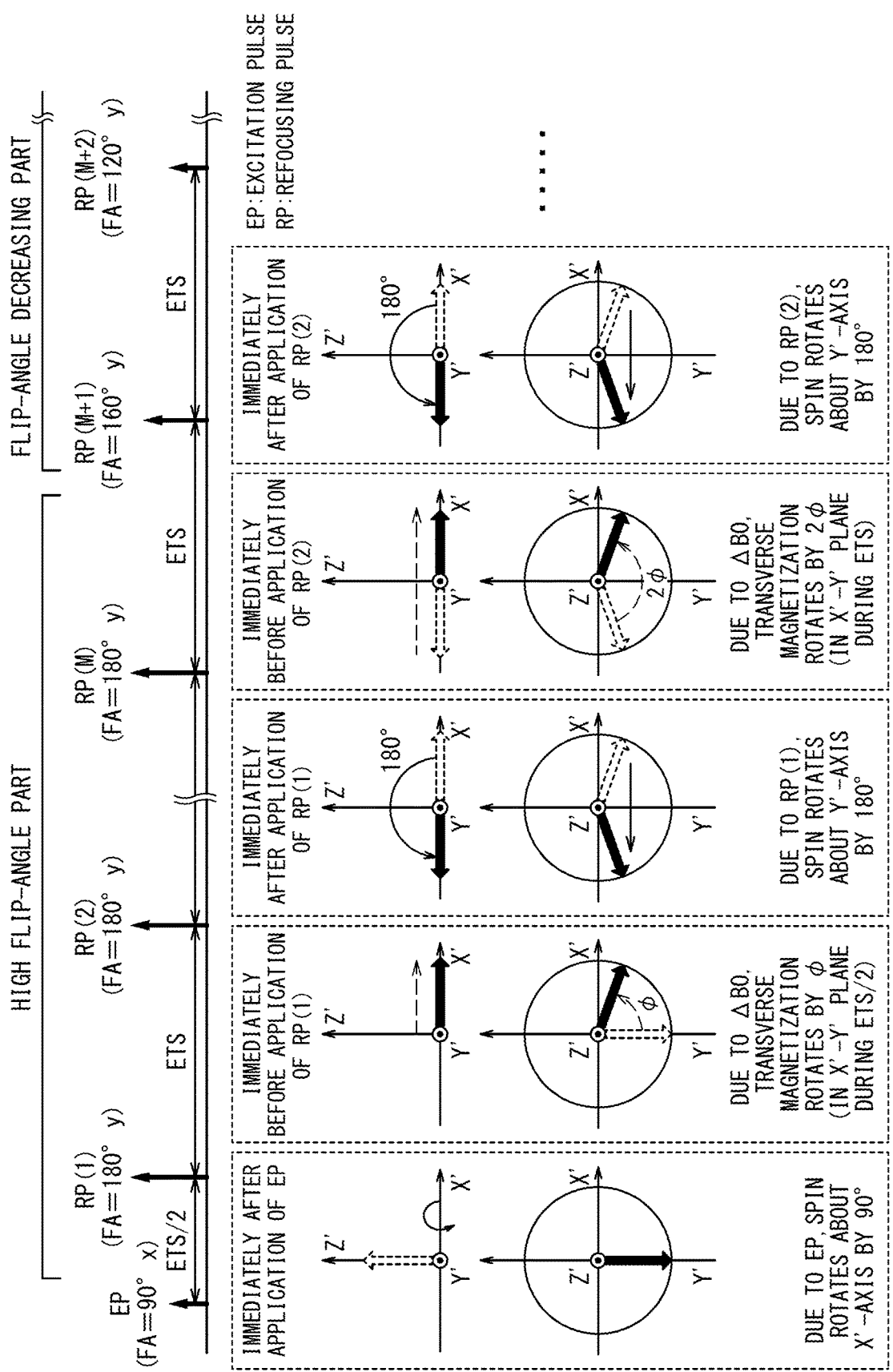
FIG. 8 is the first diagram illustrating the reason for which recovery of longitudinal magnetization is accelerated.
Figure 9:
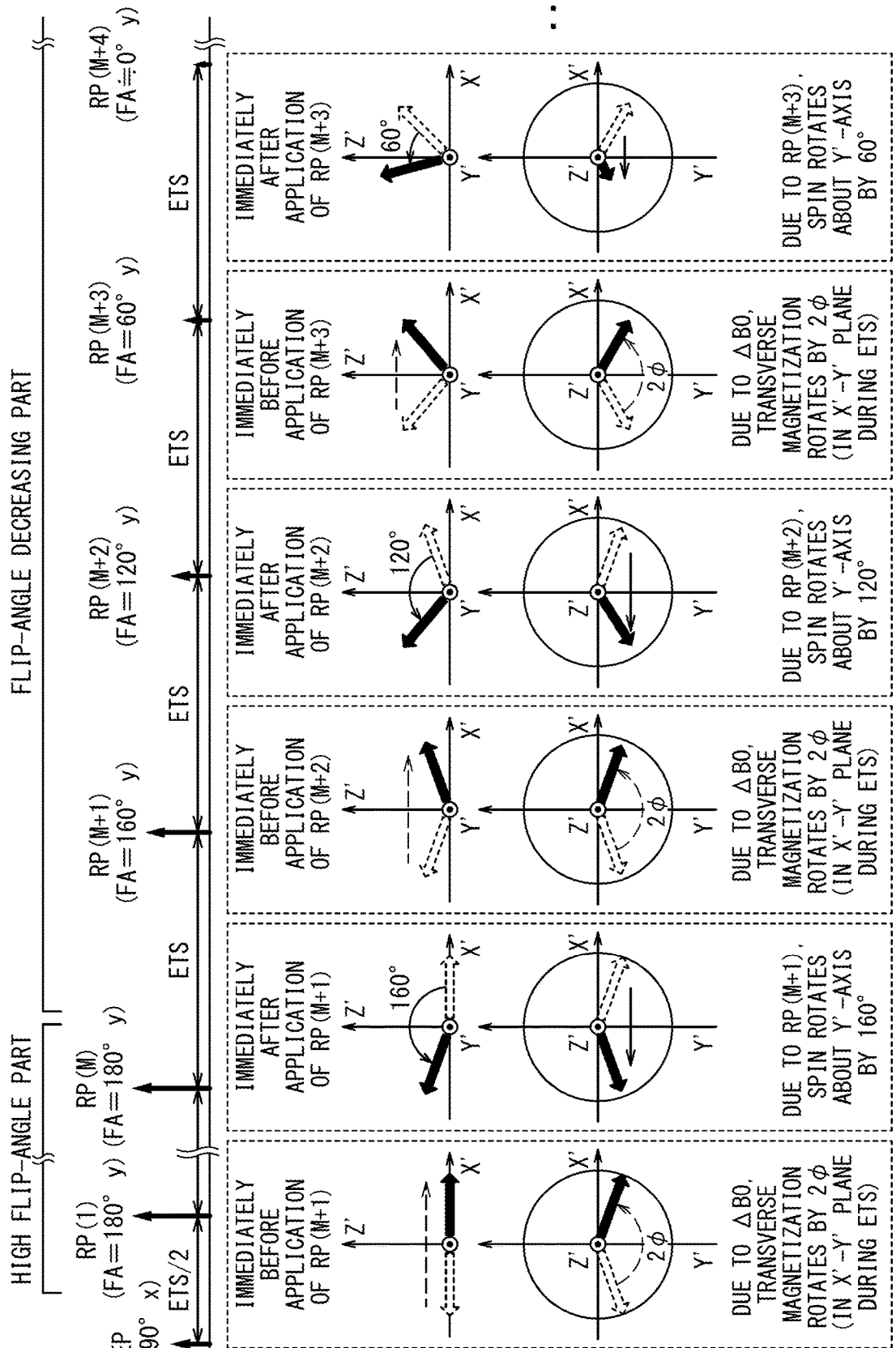
FIG. 9 is the second diagram illustrating the reason for which recovery of longitudinal magnetization is accelerated.

FIG. 8 and FIG. 9 are diagrams illustrating the reason why recovery of longitudinal magnetization is accelerated by providing the flip-angle decreasing part in the series of refocusing pulses, by using vectors indicative of behavior of spin (i.e., macroscopic magnetization) in a rotating coordinate system. Note that FIG. 8 is a diagram indicating behavior of spin in the high flip-angle part, and FIG. 9 is a diagram indicating behavior of spin in the flip-angle decreasing part.

The top part in each of FIG. 8 and FIG. 9 indicates an RF pulse train. In FIG. 8 and FIG. 9, each excitation pulse is abbreviated to "EP" and each refocusing pulse is abbreviated to "RP". Further, application temporal order "n" of each of refocusing pulses is indicated as number in a parenthesis like RP(n). Furthermore, a flip angle of each of RF pulses is abbreviated to "FA", and an application direction (x-axis direction or y-axis direction) of each of RF pulses is shown as a letter added on the right side of flip angle FA like FA=180° y.

In each of broken-line frames shown in FIG. 8 and FIG. 9, behavior of spin immediately after application of each RF pulse or behavior of spin immediately before application of each RF pulse is illustrated. In the upper part of each of the broken-line frames, behavior of spin in an X'-Z' plane in a rotating coordinate system is illustrated, and in the lower part of each of the broken-line frames, behavior of spin in an plane in a rotating coordinate system is illustrated. A Z'-axis direction component of spin in an X'-Z' plane indicates a longitudinal magnetization component, i.e., magnitude of longitudinal magnetization. Additionally, in an plane, behavior of transverse magnetization of spin is indicated.

In FIG. 8 and FIG. 9, the flip angle FA of the excitation pulse is assumed to be 90°, and the flip angle of the refocusing pulses in the high flip-angle part is assumed to be 180°. Further, as shown in FIG. 9, flip angles of the respective refocusing pulse in the flip-angle decreasing part are assumed to decrease by taking values of 160°, 120°, and 60°.

First, as shown in the leftmost column in FIG. 8, by applying the excitation pulse EP, spin, which is initially directed to the Z'-axis direction (i.e., the initial state of longitudinal magnetization) is rotated by 90° about the X'-axis so as to fall in the Y'-axis and generate transverse magnetization. This transverse magnetization rotates by phase $\varphi(\varphi=\gamma\Delta B_0^*(ETS/2))$, where $\gamma$ is the gyromagnetic ratio) in an X'-Y' plane during ETS/2, due to non-uniformity $\Delta B_0$ of a static magnetic field, which brings spin to the state shown in the second column from the left in FIG. 8 immediately before application of the first refocusing pulse RP(1).

Next, the refocusing pulse RP(1) is applied, which causes spin to rotate about the Y'-axis by 180°. Thus, spin is brought to the state shown in the third column from the left in FIG. 8 immediately after application of the refocusing pulse RP(1).

Then, during ETS starting from the application timing of the refocusing pulse RP(1), the transverse magnetization rotates again in an X'-Y' plane by phase $2\varphi$ due to the non-uniformity $\Delta B_0$ of the static magnetic field. Thus, spin is brought to the state shown in the fourth column from the left in FIG. 8 immediately before application of the second refocusing pulse RP(2).

And then, the second refocusing pulse RP(2) is applied, which causes spin to rotate about the Y'-axis by 180°. Thus, spin is brought to the state shown in the fifth column from the left in FIG. 8 immediately after application of the refocusing pulse RP(2).

After that, each time a refocusing pulse is applied in the high flip-angle part, the two states of spin shown in the fourth and fifth columns from the left in FIG. 8 are alternately repeated. In FIG. 8, it is assumed that recovery of longitudinal magnetization in the high flip-angle part is small enough to be negligible. In other words, it is assumed that a longitudinal magnetization component in the high flip-angle part is small enough to be regarded as zero.

Next, behavior of spin in the flip-angle decreasing part will be described with reference to FIG. 9. The leftmost column in FIG. 9 illustrates the state of spin at the timing when an ETS has elapsed from the application timing of the final refocusing pulse RP(M) in the high flip-angle part. In other words, the leftmost column in FIG. 9 illustrates the state of spin immediately before application of the first refocusing pulse RP(M+1) in the flip-angle decreasing part. In the flip-angle decreasing part, refocusing pulses, whose flip angles are gradually decreased from 180°, are sequentially applied to the spin.

In the case of the pulse sequence shown in FIG. 9, a refocusing pulse whose flip angle is 160° is applied as the first refocusing pulse RP(M+1) in the flip-angle decreasing part. As a result, immediately after application of the refocusing pulse RP(M+1), spin is rotated about the Y'-axis by 160° so as to become the state shown in the second column from the left in FIG. 9. Note that the longitudinal magnetization component having been zero in the high flip-angle part is generated as a non-zero positive component by applying the refocusing pulse RP(M+1) whose flip angle (160°) is smaller than 180° as shown in the upper part of the second leftmost broken-line frame in FIG. 9. In other words, by applying the refocusing pulse RP(M+1) whose flip angle 160°, forced recovery of longitudinal magnetization is performed.

During ETS starting from the application timing of the refocusing pulse RP(M+1), transverse magnetization rotates in an plane by 2φ due to the non-uniformity $\Delta B_0$ of the static magnetic field in a manner similar to the behavior in the high flip-angle part. As a result, spin is brought to the state shown in the third column from the left in FIG. 9 immediately before application of the second refocusing pulse RP(M+2) in the flip-angle decreasing part. Rotation of phase caused by the non-uniformity $\Delta B_0$ of the static magnetic field does not influence on a longitudinal magnetization component. Thus, as shown in the upper part of the third broken-line frame from the left in FIG. 9, the transverse magnetization of spin is reversed from the negative direction in the X'-axis to the positive direction in the X'-axis, while the longitudinal magnetization component of spin is kept unchanged.

Next, the refocusing pulse RP(M+2), whose flip angle is further reduced from 160° to 120°, is applied to such spin, which causes spin to rotate about the Y'-axis by 120°. Thus, immediately after application of the refocusing pulse RP(M+2), spin is brought to the state shown in the fourth column from the left in FIG. 9. The longitudinal magnetization component in this state is larger than the longitudinal magnetization component shown in the upper part of the second leftmost broken-line frame in FIG. 9.

The fifth column from the left in FIG. 9 illustrates the state of spin immediately before application of the third refocusing pulse RP(M+3) in the flip-angle decreasing part. Although transverse magnetization rotates by 2φ due to the non-uniformity $\Delta B_0$ of the static magnetic field, the longitudinal magnetization component recovered so far is held.

The sixth column from the left in FIG. 9 illustrates the state of spin immediately after application of the third refocusing pulse RP(M+3). The flip angle of the third refocusing pulse RP(M+3) is set to 60° which is further smaller than 120°. By applying the third refocusing pulse RP(M+3) in the flip-angle decreasing part, spin rotates about the Y'-axis by 60° and the direction of spin is further brought closer to the Z'-axis direction. As a result, the longitudinal magnetization component after application of the refocusing pulse RP(M+3) becomes larger.

Afterward, by time-sequentially applying refocusing pulses whose flip angles gradually decrease toward 0°, longitudinal magnetization is further brought closer to the Z'-axis direction. In other words, longitudinal magnetization is forcibly recovered.

In other words, it is possible to forcibly accelerate spontaneous recovery of longitudinal magnetization in accordance with a longitudinal relaxation time T1, by applying a series of refocusing pulses whose flip angles time-sequentially decrease from the predetermined high flip angle (e.g., 180°) toward 0°. The foregoing is the description for the reason why recovery of longitudinal magnetization is accelerated by providing a flip-angle decreasing part.

Figure 10:
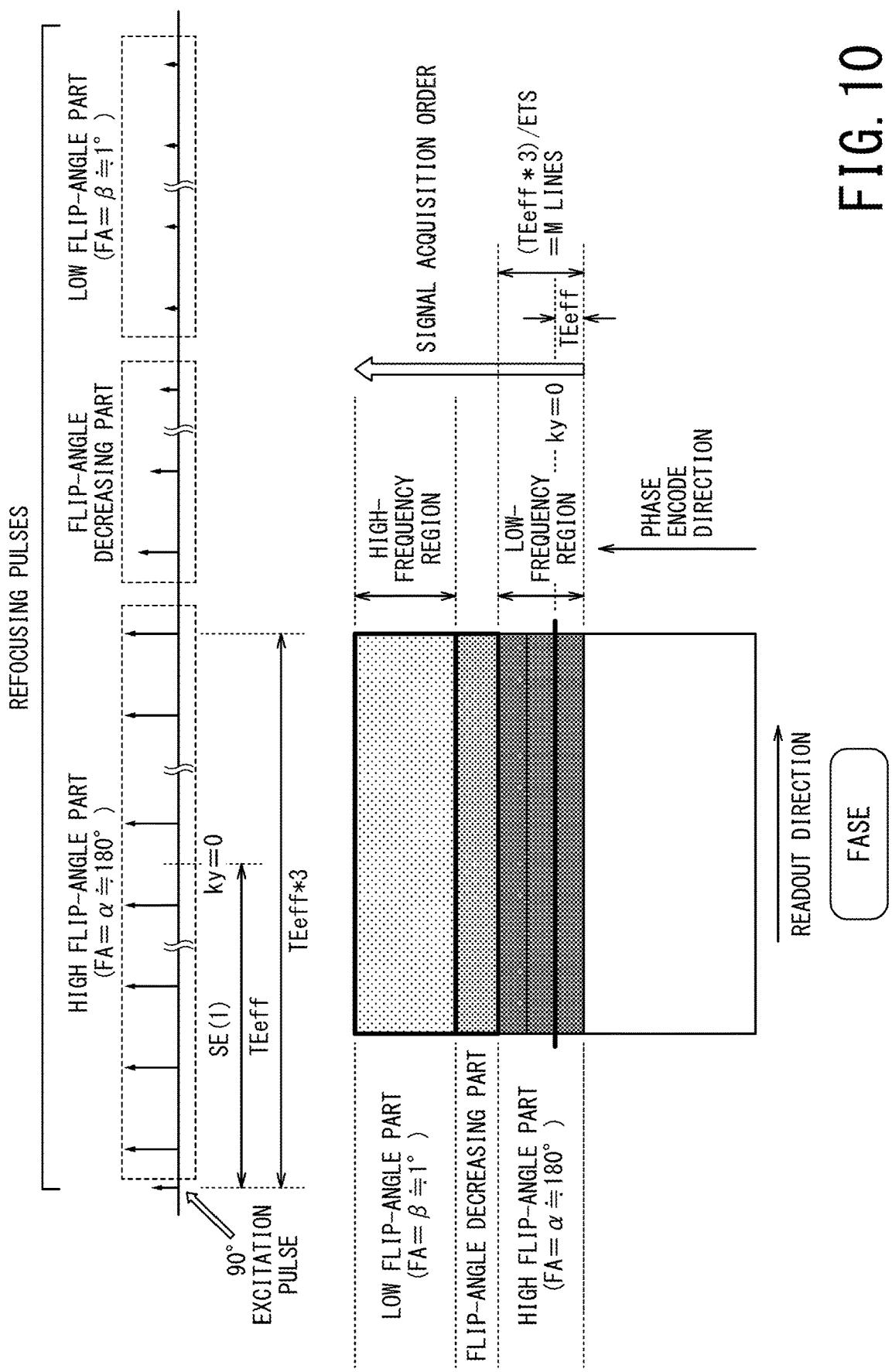
FIG. 10 is a schematic diagram illustrating acquisition temporal order of MR signals received under an FSE-type pulse sequence of the present embodiment and arrangement of data of the received MR signals in k-space.

FIG. 10 is a schematic diagram illustrating acquisition temporal order of MR signals received under an FSE-type pulse sequence of the present embodiment and arrangement of the received MR signals in k-space. The FSE-type pulse sequence shown in FIG. 10 is a pulse sequence obtained by applying an imaging method called a partial Fourier method to an FSE-type pulse sequence, and is also referred to as a fast advanced spin echo (FASE) method. In an FASE method, acquisition of MR signals corresponding to either one of positive and negative high-frequency regions of ky-space (i.e., k-space in the phase encode direction which is defined as a y direction) is omitted, which shortens an imaging time. Data of the other one of the two high-frequency regions for which MR signals are not acquired are complemented by homodyne processing or the like in image reconstruction.

In the FSE-type pulse sequence of the present embodiment, as shown in upper part of FIG. 10, a high flip-angle part is arranged to a position close to a 90° excitation pulse, a low flip-angle part is arranged to a position far from the 90° excitation pulse, and a flip-angle decreasing part is arranged between the high flip-angle part and the low flip-angle part.

Transverse magnetization is generated by applying a 90° excitation pulse, and an SNR of each of MR signals acquired in the high flip-angle part is high because transverse relaxation is not progressed so much at a timing closed to an application timing of a 90° excitation pulse. However, as time elapses from an application of a 90° excitation pulse, transverse relaxation is progressed and transverse magnetization gradually decrease. Thus, an SNR of each of MR signals acquired in the low flip-angle part, which is far from the application of the 90° excitation pulse, is small as compared with MR signals in the high flip-angle part. Additionally, in the low flip-angle part, transverse magnetization component is reduced as a result of forcibly accelerated recovery of longitudinal magnetization, which also acts as a factor of decreasing an SNR.

Meanwhile, contrast of a reconstructed image is dominated by MR signals arranged to a low-frequency region, while MR signals arranged to a high-frequency region have little influence on image contrast.

For this reason, in the pulse sequence of the present embodiment, MR signals acquired in the high flip-angle part are arranged to a low-frequency region of ky-space and MR signals acquired in the low flip-angle part are arranged to a high-frequency region of ky-space. Further, MR signals acquired in the flip-angle decreasing part are arranged to a region between a low-frequency region and a high-frequency region in ky-space.

More specifically, phase encode amount in the high flip-angle part is set in such a manner that MR signals acquired in the high flip-angle part are arranged to a low-frequency region of ky-space. Then, phase encode amount in the low flip-angle part is set in such a manner that MR signals acquired in the low flip-angle part are arranged to a high-frequency region of ky-space. Further, phase encode amount in the flip-angle decreasing part is set in such a manner that MR signals acquired in the flip-angle decreasing part are arranged to a region between a low-frequency region and a high-frequency region in ky-space.

For instance, as shown in FIG. 10, acquisition of MR signals is started from one end of the negative side in the low-frequency region of the central part of ky-space. After this, the MRI apparatus 1 acquires MR signals until phase encode amount reaches the maximum value in the positive high-frequency region, while increasing phase encode amount in the positive direction.

By setting acquisition order of MR signals and arrangement of acquired MR signals in k-space in the above-described manner, MR signals with high SNR acquired in the high flip-angle part are arranged to a low-frequency region which has a large influence on image contrast, while MR signals with comparatively low SNR acquired in the low flip-angle part are arranged to a high-frequency region whose influence on image contrast is weak. As a result, an image with satisfactory image quality can be obtained.

As shown in FIG. 10, an effective echo time TEeff is a time from an application timing of an excitation pulse to a timing of ky=0. The number of data acquisitions in the high flip-angle part (i.e., number M of refocusing pulses in a high flip-angle part) may be set to, e.g., number obtained by dividing time length being three times as long as the effective echo time TEeff by ETS (i.e., M=(TEeff*3)/ETS).

Figure 11:
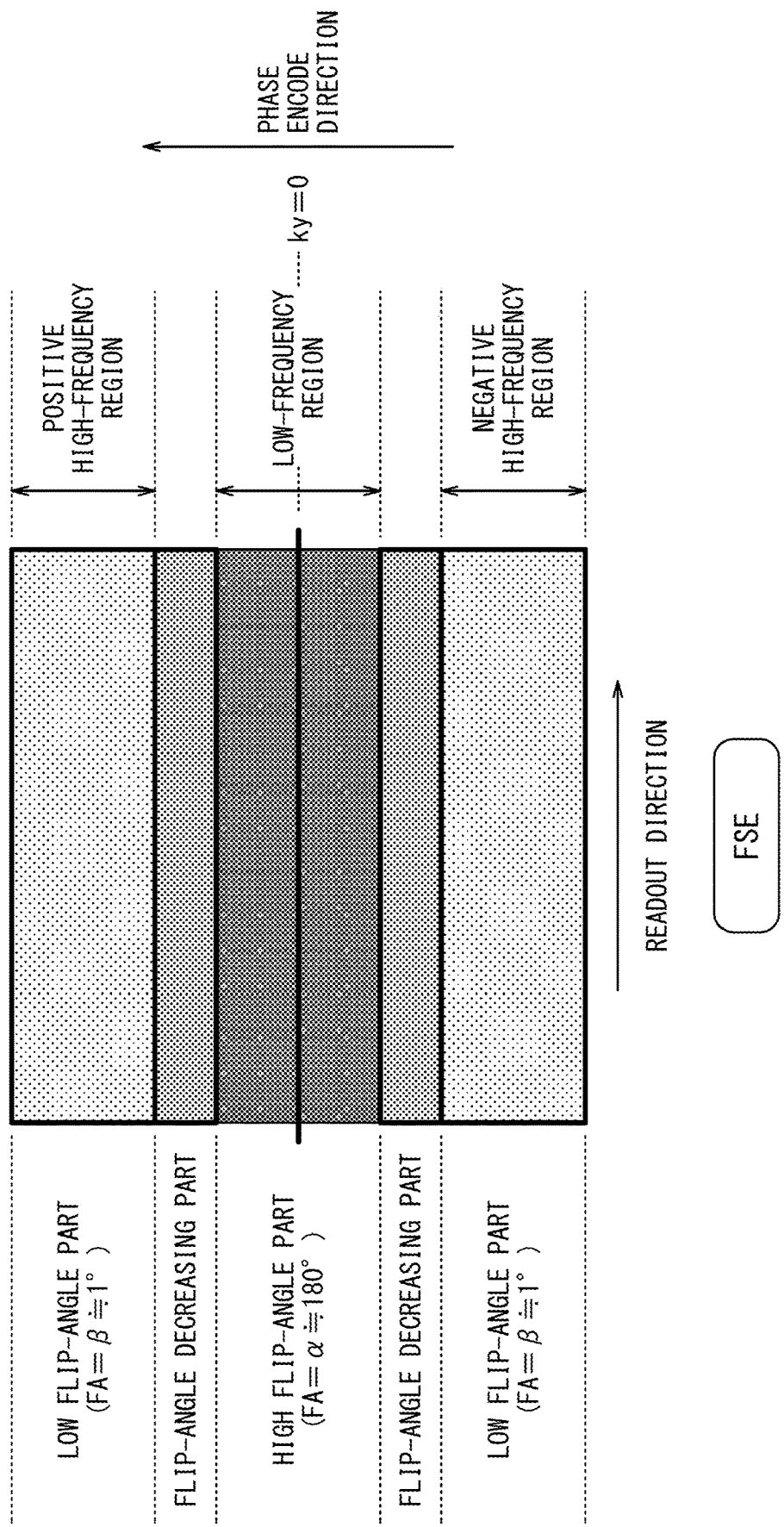
FIG. 11 is a schematic diagram illustrating a case where MR signals are arranged over the entire region of k-space.

In contrast to FIG. 10, FIG. 11 is a schematic diagram illustrating a case where MR signals are arranged over the entire region of k-space. Also in the case of FIG. 11, MR signals acquired in the high flip-angle part are arranged to a low-frequency region, while MR signals acquired in the low flip-angle part are arranged to frequency regions (in this case, positive and negative high-frequency regions).

Figure 12:
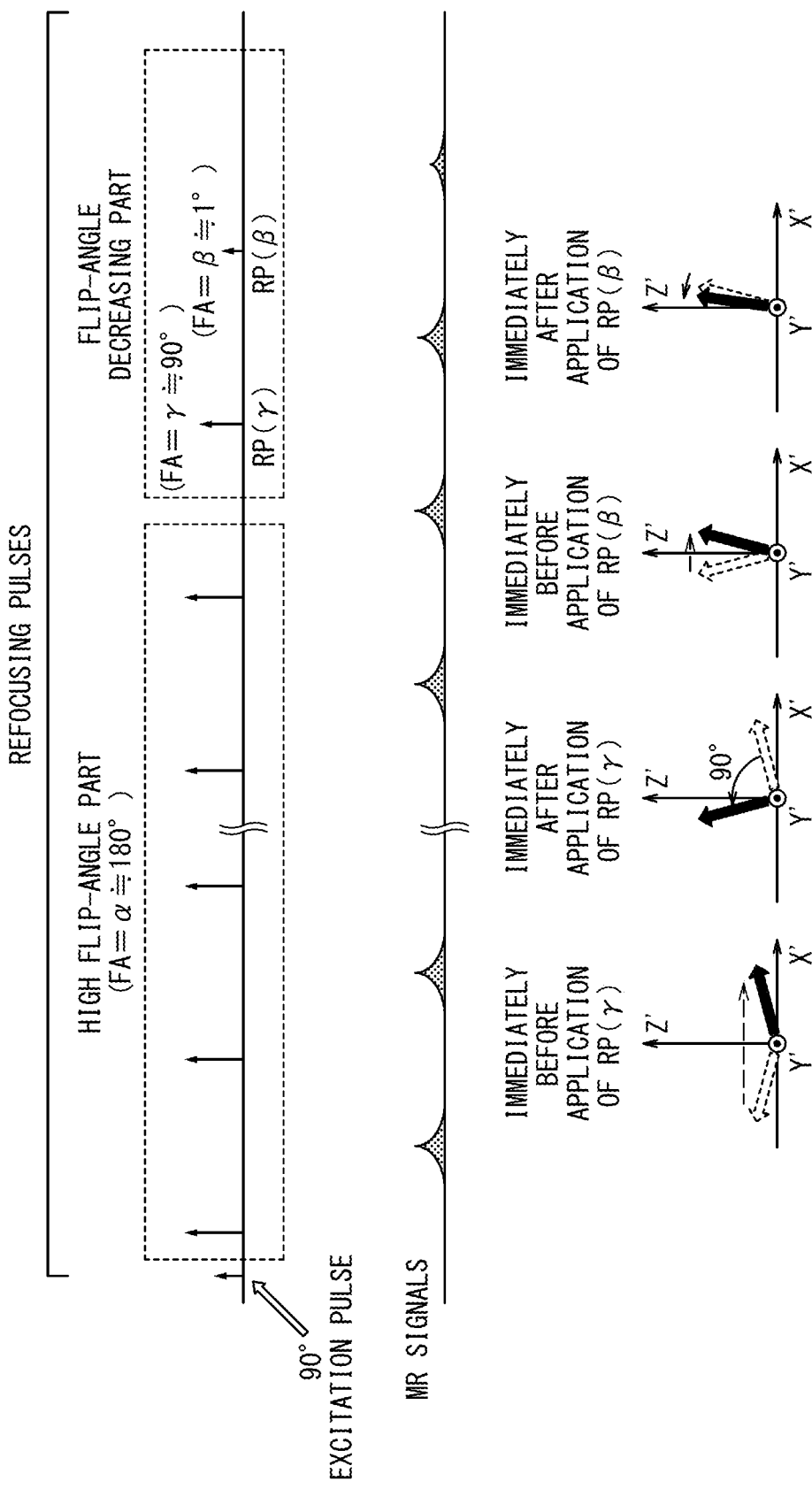
FIG. 12 is a schematic timing chart illustrating another FSE-type pulse sequence of the present embodiment.

FIG. 12 is a timing chart illustrating another FSE-type pulse sequence of the present embodiment. The ESE-type pulse sequence shown in the top part of FIG. 12 includes a high flip-angle part during which flip angles of refocusing pulses are α (e.g., 180°) in common and a flip-angle decreasing part. In the flip-angle decreasing part, a refocusing pulse RP(γ) whose flip angle is γ and a refocusing pulse RP(β) whose flip angle is β are included. Also in this case, flip angles of the respective refocusing pulses in the flip-angle decreasing part time-sequentially decreases from the predetermined high flip angle toward 0°.

The flip angle γ is smaller than the flip angle α, and is, e.g., approximately 90°. Additionally, the flip angle is smaller than the flip angle γ, and is e.g., approximately 1°. As shown in the middle part of FIG. 12, respective MR signals are acquired for two refocusing pulse RP(γ) and RP(β).

As clearly understood from four diagrams in the bottom part of FIG. 12, longitudinal magnetization, i.e., a Z'-axis component of spin is forcibly recovered also by the above-described two refocusing pulses RP(γ) and RP(β) in the flip-angle decreasing part of the embodiment shown in FIG. 12. As a result, recovery of longitudinal magnetization is accelerated, and an imaging time can be shortened.

In each of the above-described embodiments, the entirety of a series of refocusing pulses is divided into at least a high flip-angle part and a flip-angle decreasing part. Additionally, in the embodiment shown in FIG. 6, the low flip-angle part in which flip angle is set to near 0° are also included in addition to the high flip-angle part and the flip-angle decreasing part. Further, in the flip-angle decreasing part and the low flip-angle part, refocusing pulses whose flip angels are smaller than that in the high flip-angle part are applied. Thus, an SAR can be considerably reduced as compared with a conventional FSE-type pulse sequence in which the entirety of a series of refocusing pulses are uniformly set to high flip angle of 180°.

Each pulse sequence of the present embodiment can be applied to various types of imaging methods as long as an FSE-type pulse sequence is used. For instance, by applying one of the FSE-type pulse sequences of the above-described embodiments to an FBI method and/or a Time-SLIP method used in non-contrast MRA, an imaging time can be shortened and an SAR can be reduced in those imaging methods. Additionally, by applying one of the pulse sequences of the above-described embodiments to various types of imaging method using an FSE-type pulse sequence such as a fluid attenuated inversion recovery (FLAIR) method mainly used for imaging a head and an MSK method, an imaging time can be shortened and an SAR can be reduced in those imaging methods.

As described above, the MRI apparatus of each of possible embodiments of the present disclosure can reduce an SAR and shorten an imaging time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a memory to store a predetermined program; and
processing circuitry configured, by executing the predetermined program, to
set a fast spin echo (FSE) pulse sequence in which an excitation pulse is followed by a plurality of refocusing pulses, the plurality of the refocusing pulses being divided into at least a first pulse group subsequent to the excitation pulse and a second pulse group subsequent to the first pulse group, the first pulse group including refocusing pulses each having a predetermined high flip angle equal to or higher than 180 degrees, and the second pulse group including refocusing pulses having flip angles decreasing from the predetermined high flip angle to a flip angle equal to or higher than zero degrees and lower than 5 degrees, wherein the plurality of refocusing pulses extend in time to another excitation pulse of the FSE pulse sequence, and, for the plurality of refocusing pulses, the flip angle of the refocusing pulses monotonically decrease as a function of time up to the another excitation pulse, and
generate an image of an object from respective MR signals corresponding to the plurality of refocusing pulses acquired by applying the fast spin echo pulse sequence to the object.

2. The magnetic resonance imaging apparatus according to claim 1, wherein the processing circuitry is further configured to set the fast spin echo pulse sequence in which the plurality of refocusing pulses are divided into the first pulse group, the second pulse group, and a third pulse group subsequent to the second pulse group, the third pulse group including refocusing pulses having a predetermined low flip angle.

3. The magnetic resonance imaging apparatus according to claim 2, wherein the processing circuitry is further configured to set the fast spin echo pulse sequence in such a manner that the predetermined low flip angle is higher than 0° and is lower than 5°.

4. The magnetic resonance imaging apparatus according to claim 2, wherein the processing circuitry is further configured to set the fast spin echo pulse sequence in such a manner that MR signals corresponding to the refocusing pulses having the predetermined high flip angle are arranged in a low-frequency region in k-space, and MR signals corresponding to the refocusing pulses having the predetermined low flip angle are arranged in a high-frequency region in k-space.

5. The magnetic resonance imaging apparatus according to claim 4, wherein the processing circuitry is further configured to set the fast spin echo pulse sequence in such a manner that MR signals corresponding to the refocusing pulses having the predetermined low flip angle are arranged in a high-frequency region of one of a positive side and a negative side in k-space.

6. The magnetic resonance imaging apparatus according to claim 1, wherein the processing circuitry is further configured to set the fast spin echo pulse sequence in such a manner that flip angles of respective refocusing pulses in the second pulse group exponentially decrease from the predetermined high flip angle toward the flip angle of zero.

7. The magnetic resonance imaging apparatus according to claim 2, wherein the processing circuitry is further configured to
acquire the predetermined high flip angle in the first pulse group, the predetermined low flip angle in the first pulse group, and a number of the refocusing pulses in the first pulse group, and
set the fast spin echo pulse sequence based on the acquired predetermined high flip angle in the first pulse group, the acquired predetermined low flip angle in the third pulse group, and the acquired number of the refocusing pulses in the first pulse group.

8. The magnetic resonance imaging apparatus according to claim 2, wherein the processing circuitry is further configured to set the fast spin echo pulse sequence based on the predetermined high flip angle, the predetermined low flip angle, and a number of the refocusing pulses included in the first pulse group, in such a manner that respective flip angles of the refocusing pulses in the second pulse group exponentially decrease from the predetermined high flip angle toward the predetermined low flip angle.

9. The magnetic resonance imaging apparatus according to claim 1, wherein the processing circuitry is further configured to set the fast spin echo pulse sequence in such a manner that flip angles of 180°, 90°, and an angle less than 90° are set to the respective refocusing pulses in the second pulse group.

10. A magnetic resonance imaging apparatus, comprising:
a memory to store a predetermined program; and
processing circuitry configured, by executing the predetermined program, to
set a fast spin echo (FSE) pulse sequence in which an excitation pulse is followed by a plurality of refocusing pulses, the plurality of the refocusing pulses being divided into at least a first pulse group subsequent to the excitation pulse and a second pulse group subsequent to the first pulse group, the first pulse group including refocusing pulses each having a predetermined high flip angle equal to or higher than 180 degrees, and the second pulse group including refocusing pulses having flip angles decreasing from the predetermined high flip angle to a flip angle equal to or higher than zero degrees and lower than 5 degrees, wherein the plurality of refocusing pulses extend in time to another excitation pulse of the FSE pulse sequence, and, for the plurality of refocusing pulses, the flip angle of the refocusing pulses monotonically decrease as a function of time up to the another excitation pulse, and
generate an image of an object from respective MR signals corresponding to the plurality of refocusing pulses acquired by applying the fast spin echo pulse sequence to the object,
wherein the processing circuitry is further configured to set the fast spin echo pulse sequence in such a manner that a flip angle equal to or higher than 180°, a flip angle of 90°, and a flip angle less than 90° are set to the respective refocusing pulses in the second pulse group.

* * * * *